United States Patent
Kempen et al.

(10) Patent No.: US 9,192,039 B2
(45) Date of Patent: Nov. 17, 2015

(54) RADIATION SOURCE

(75) Inventors: Antonius Theodorus Wilhelmus Kempen, Rosmalen (NL); Erik Roelof Loopstra, Eindhoven (NL); Corne Rentrop, Eindhoven (NL); Dennis De Graaf, Waalre (NL); Frits Gubbels, Helmond (NL); Gregory Richard Hayes, Eindhoven (NL); Hubertus Johannes Van De Wiel, 's-Hertogenbosch (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 14/241,993

(22) PCT Filed: Jul. 27, 2012

(86) PCT No.: PCT/EP2012/064793
§ 371 (c)(1),
(2), (4) Date: Feb. 28, 2014

(87) PCT Pub. No.: WO2013/029898
PCT Pub. Date: Mar. 7, 2013

(65) Prior Publication Data
US 2014/0203193 A1 Jul. 24, 2014

Related U.S. Application Data

(60) Provisional application No. 61/530,796, filed on Sep. 2, 2011.

(51) Int. Cl.
*G21K 5/00* (2006.01)
*H05G 2/00* (2006.01)
*G03F 7/20* (2006.01)

(52) U.S. Cl.
CPC ............ *H05G 2/008* (2013.01); *G03F 7/70033* (2013.01); *G03F 7/70916* (2013.01); *H05G 2/006* (2013.01); *H05G 2/005* (2013.01)

(58) Field of Classification Search
USPC .................. 250/492.1, 492.2, 492.22, 492.23, 250/493.1, 494.1, 504 R
See application file for complete search history.

(56) References Cited

U.S. PATENT DOCUMENTS

| | | |
|---|---|---|
| 5,715,290 A | 2/1998 | Uetake et al. |
| 6,385,290 B1 | 5/2002 | Kondo et al. |
| 7,122,816 B2 | 10/2006 | Algots et al. |
| 2006/0017782 A1* | 1/2006 | Nishi et al. ........................ 347/55 |
| 2010/0019173 A1* | 1/2010 | Someya et al. ............. 250/496.1 |

(Continued)

OTHER PUBLICATIONS

International Search Report directed to related International Patent Application No. PCT/EP2012/064793, mailed Nov. 27, 2012; 4 pages.

(Continued)

*Primary Examiner* — Nicole Ippolito
(74) *Attorney, Agent, or Firm* — Sterne, Kessler, Goldstein & Fox P.L.L.C.

(57) ABSTRACT

A radiation source having a nozzle configured to direct a stream of fuel droplets along a trajectory towards a plasma formation location, a laser configured to direct laser radiation at the fuel droplets at the plasma formation location to generate, in use, a radiation generating plasma. The nozzle has an internal surface that is configured to prevent contamination present in fuel used to form the fuel droplets from being deposited on that internal surface.

12 Claims, 3 Drawing Sheets

(56) References Cited

U.S. PATENT DOCUMENTS

2010/0097423 A1  4/2010  Inoue
2010/0141709 A1  6/2010  Debrabander et al.
2010/0143202 A1  6/2010  Yabu et al.
2010/0200776 A1  8/2010  Yabu et al.
2011/0084996 A1  4/2011  Hirato et al.

OTHER PUBLICATIONS

International Preliminary Report on Patentability and Written Opinion of the International Searching Authority directed to related International Patent Application No. PCT/EP2012/064793, mailed Mar. 4, 2014; 7 pages.

* cited by examiner

RADIATION SOURCE

CROSS-REFERENCE TO RELATED APPLICATIONS

This application claims the benefit of U.S. provisional application 61/530,796, which was filed on Sep. 2, 2012, and which is incorporated herein in its entirety by reference.

FIELD

The present invention relates to a nozzle for use in generating fuel droplets in a radiation source, suitable for use in conjunction with, or forming part of, a lithographic apparatus. The present invention also relates more generally to a nozzle for generating liquid droplets, and to a method of forming such a nozzle.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles (i.e., droplets) of a suitable fuel material (e.g., tin, which is currently thought to be the most promising and thus likely choice of fuel for EUV radiation sources), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source. In an alternative system, which may also employ the use of a laser, radiation may be generated by a plasma formed by the use of an electrical discharge—a discharge produced plasma (DPP) source.

A proposed LPP radiation source generates a continuous stream of fuel droplets. The radiation source comprises a nozzle for directing fuel droplets toward a plasma formation location. The droplets need to be directed to the plasma formation location with a high degree of accuracy in order to ensure that a laser beam may be directed toward and into contact with the droplets. In order to achieve this, fuel should pass through the nozzle without encountering any unexpected or unintentional obstructions or restrictions. Such obstructions or restrictions may result from contamination in the fuel being deposited on an internal surface of the nozzle. The contamination can result in a stream of droplets directed by the nozzle not having one or more required properties, for example a desired trajectory or a desired droplet size, shape or frequency. As a result, this can lead to the radiation source as a whole not functioning as intended, for example not being able to generate radiation, or not being able to generate radiation of the required intensity or for a required duration.

Although problems have been described in relation to nozzles used in LPP radiation sources, the same or similar problems may be encountered in conjunction with nozzles used in other liquid droplet generators, for example nozzles used in ink-jet printing or the like.

SUMMARY

It is desirable to obviate or mitigate at least one problem of the prior art, whether identified herein or elsewhere, or to provide an alternative to existing apparatus or methods.

According to a first aspect of the present invention, there is provided a radiation source comprising: a nozzle configured to direct a stream of fuel droplets along a trajectory towards a plasma formation location; a laser configured to direct laser radiation at the fuel droplets at the plasma formation location to generate, in use, a radiation generating plasma; wherein the nozzle has an internal surface that is configured to prevent contamination present in fuel used to form the fuel droplets from being deposited on that internal surface.

The internal surface may comprise a coating.

The coating may provide a smoother or less sticky surface for the contamination than material on which the coating is applied.

The coating may comprise polytetrafluoroethylene, or a material derived from a sol-gel coating process.

The coating may be capable of withstanding a temperature of greater than 232° C., or greater than 250° C.

The internal surface may be a surface (e.g., an internal surface) of a body of material used to form the nozzle.

The body of material may comprise diamond, or glass, or a metal (e.g., molybdenum, tungsten), or a ceramic.

The fuel may comprise tin.

The contamination may comprise or be tin oxide particles.

According to a second aspect of the present invention, there is provided a lithographic apparatus comprising: an illumination system for providing a radiation beam; a patterning device for imparting the radiation beam with a pattern in its cross-section; a substrate holder for holding a substrate; a projection system for projecting the patterned radiation beam onto a target portion of the substrate, and wherein the lithographic apparatus further comprises, or is in connection with, the radiation source of the first aspect of the invention.

According to a third aspect of the present invention, there is provided nozzle for use in a liquid (e.g., fuel or ink) droplet generator, wherein the nozzle has an internal surface that is configured to prevent contamination present in liquid used to form the liquid droplets from being deposited on that internal surface.

According to a fourth aspect of the present invention, there is provided method of forming a nozzle for use in a liquid droplet generator, the method comprising: providing the nozzle with an internal surface that is configured to prevent contamination present in liquid used to form the liquid droplets from being deposited on that internal surface.

A wet coating process may be used to provide the internal surface (e.g., in the form of a coating).

The coating may be provided using a sol-gel coating process, or using a coating in fluid suspension.

A liquid used in the wet coating process may be cured after being applied (e.g., to provide a solid coating).

The internal surface may be provided by forming a conduit through a body of material used to form the nozzle. The internal surface will then be formed from the same material as the nozzle.

It will be appreciated that features described in relation to the first aspect may, where appropriate, be applicable to the second, third and/or fourth aspects.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
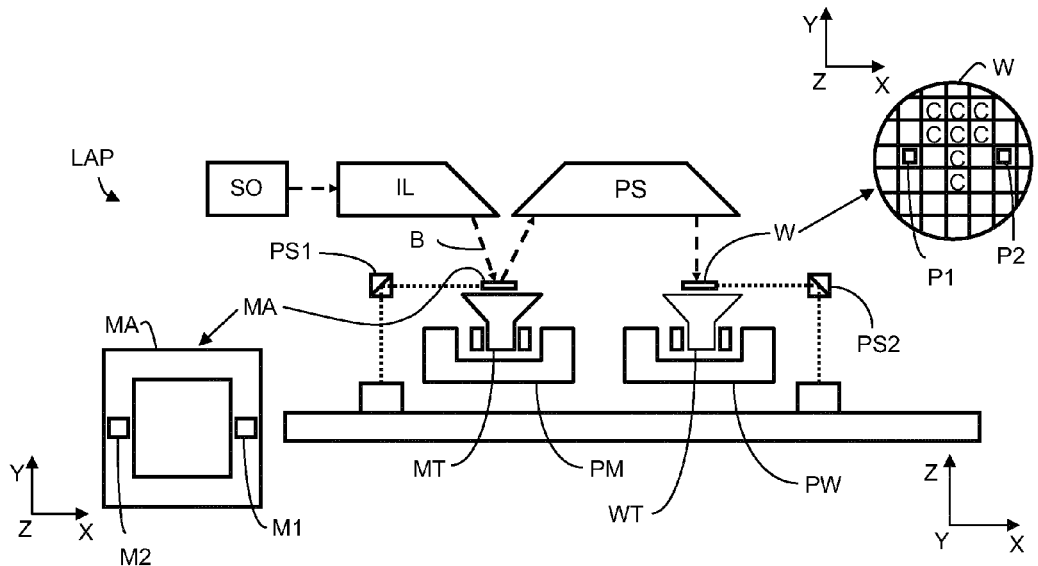
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus LAP including a source collector module SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam and exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
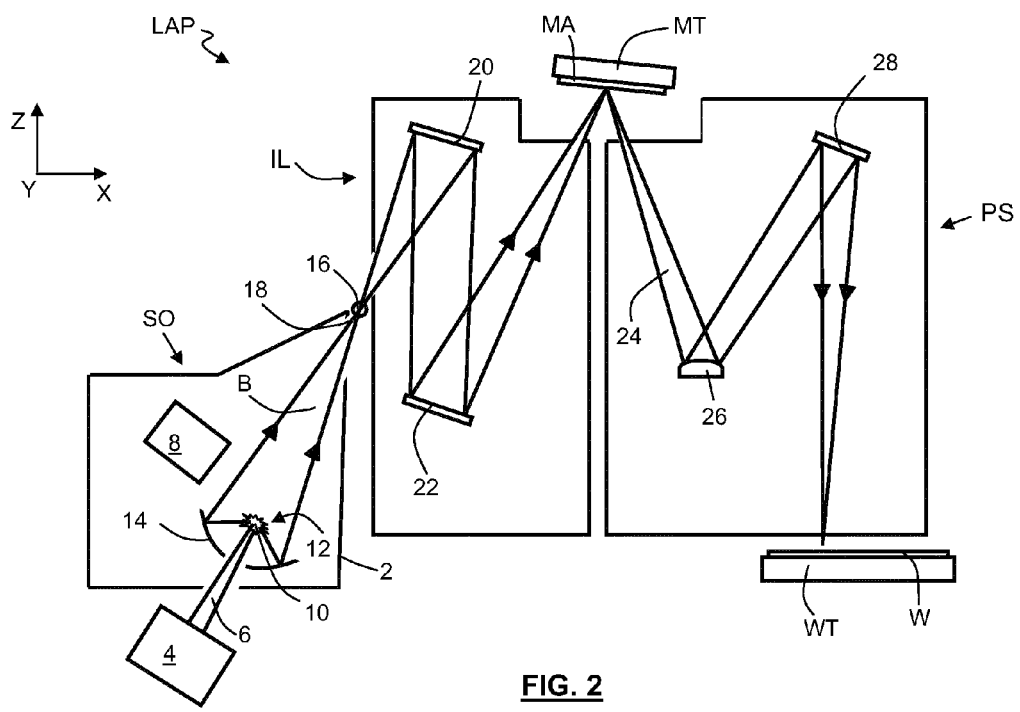
FIG. 2 is a more detailed view of the apparatus of FIG. 1, including an LPP source collector module.

FIG. 2 shows the lithographic apparatus LAP in more detail, including the source collector module SO, the illumination system IL, and the projection system PS. The source collector module SO is constructed and arranged such that a vacuum environment can be maintained in an enclosing structure 2 of the source collector module.

A laser 4 is arranged to deposit laser energy via a laser beam 6 into a fuel, such as xenon (Xe), tin (Sn) or lithium (Li) that is provided from a fuel supply 8. Tin (most likely in the form of droplets) is currently thought to be the most promising and thus likely choice of fuel for EUV radiation sources. The deposition of laser energy into the fuel creates a highly ionized plasma 10 at a plasma formation location 12 that has electron temperatures of several tens of electronvolts (eV). The energetic radiation generated during de-excitation and recombination of these ions is emitted from the plasma 10, collected and focussed by a near normal incidence radiation collector 14. A laser 4 and a fuel supply 8 (and/or a collector 14) may together be considered to comprise a radiation source, specifically an EUV radiation source. The EUV radiation source may be referred to as a laser produced plasma (LPP) radiation source.

A second laser (not shown) may be provided, the second laser being configured to preheat the fuel before the laser beam 6 is incident upon it. An LPP source that uses this approach may be referred to as a dual laser pulsing (DLP) source.

Although not shown, the fuel supply will comprise, or be in connection with, a nozzle configured to direct a stream of fuel droplets along a trajectory towards the plasma formation location 12.

Radiation B that is reflected by the radiation collector 14 is focused at a virtual source point 16. The virtual source point 16 is commonly referred to as the intermediate focus, and the source collector module SO is arranged such that the intermediate focus 16 is located at or near to an opening 18 in the enclosing structure 2. The virtual source point 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures, for example there may be 1-6 additional reflective elements present in the projection system PS than shown in FIG. 2.

Figure 3:
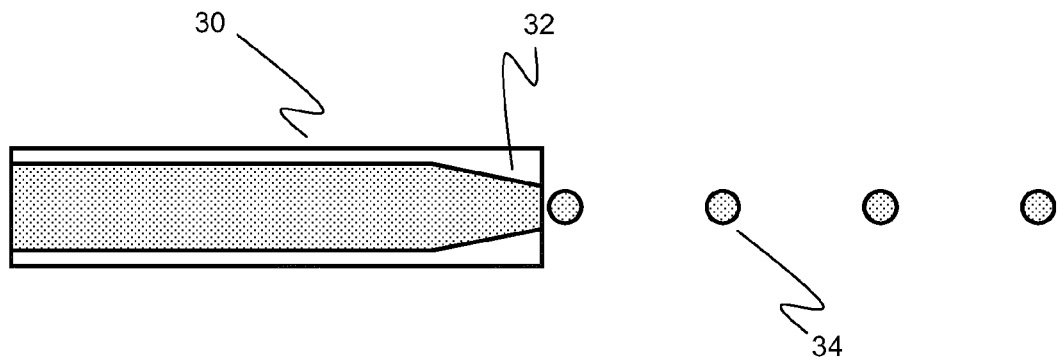
FIG. 3 schematically depicts a nozzle of a radiation source configured to direct a stream of fuel droplets along a trajectory towards a plasma formation location.

FIG. 3 schematically depicts a part of the fuel supply as shown in and described with reference to FIG. 2. The part of the fuel supply is shown as comprising a conduit 30 that includes and leads to a nozzle 32 configured to direct a stream of droplets of fuel 34 along a trajectory towards a plasma formation location (not shown).

Stability and/or clogging (i.e., at least partial blocking) of the nozzle 32 are issues that may arise during use of the nozzle 32, as they do for any ink-jet printing application. Clogs will be formed by contamination in the fuel. Clogging of the nozzle 32 may impose a lifetime limit on the nozzle and thus the droplet generator (or at least a time limit at which limit maintenance/cleaning is required) and may therefore limit the availability of the radiation source or the lithographic apparatus as a whole.

It is most likely that the nozzle 32 of the droplet generator will have the smallest, or one of the smallest, diameters as compared to other conduits and the like of a fuel flow system forming part of the droplet generator (except, perhaps, for filters present in that system). Since the nozzle 32 will have one of the smallest diameters, it is likely that clogging in the fuel flow system will occur near or at the nozzle 32, and likely within the nozzle 32 that is a restriction in the flow system. It is likely that clogs or the like larger than the nozzle diameter will be filtered out in some way further upstream in the fuel flow system. However, clogs smaller than the nozzle diameter and within the nozzle might result in a change in the effective geometry of the nozzle.

A change in effective geometry may result in a change in the parameters of the generated stream of droplets, for instance the droplet shape or size, or most likely a direction of trajectory of the stream of droplets. In many applications, such parameters will need to meet stringent requirements. In an EUV radiation source in particular, the requirements of the droplet generator will be extremely stringent in terms of the trajectory of the droplet stream. For instance, at a plasma formation location, the location of a droplet may need to be accurate to within a few microns, but at the same time the nozzle 32 itself may need to be located relatively far away from the plasma formation location, for instance by a distance of a few tens of centimeters or so. This results in a direction stability requirement of the trajectory of the stream of droplets of perhaps less than 10 microradians. The overall result is that even very small particulate contamination deposited on an internal surface of the nozzle can change the effective geometry of the nozzle to such an extent to ensure that the direction stability requirement is not met. This might, in turn have a detrimental affect on the operation of the radiation source and thus the lithographic apparatus as a whole, for example in terms of the generation of radiation.

Figure 4:
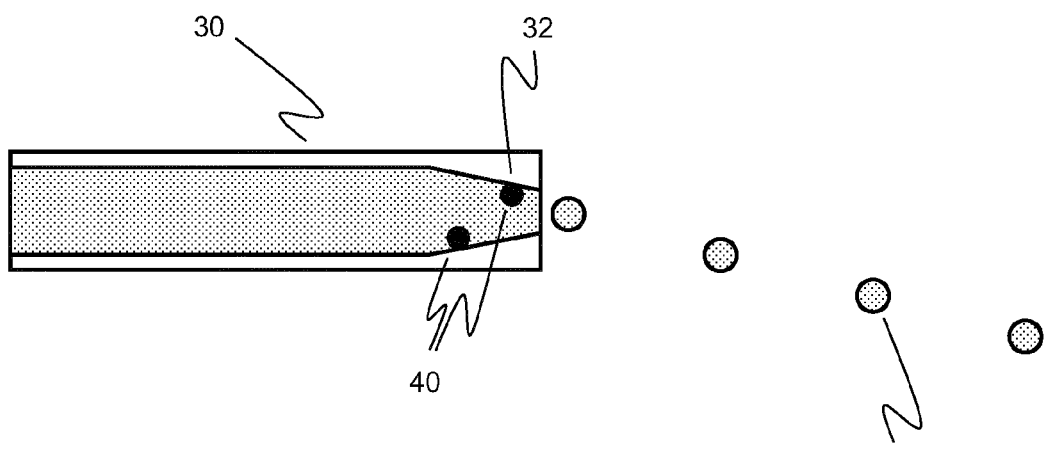
FIG. 4 schematically depicts contamination deposition on an internal surface of the nozzle of FIG. 3, and an affect on trajectory of droplets leaving the nozzle.

FIG. 4 schematically depicts the same conduit 30, nozzle 32 and droplet stream 34 as shown in and described with reference to FIG. 3. However, in FIG. 4 contamination in the form of particles 40 has become deposited on an internal surface of the nozzle 32. Such deposition has resulted in a change in the effective geometry of the nozzle 32 (as described above), which has resulted, in turn, in a change in trajectory of the stream of droplets 34.

The particles 40 are one example of contamination. The contamination could be particulate in form, or be anything else that might be present within the fuel used to form the droplet stream 34 (e.g., flakes, agglomerations, solutions, or the like). The contamination could arise from oxidisation of the fuel. For example, if the fuel is tin, the contamination may be tin oxide particles or the like. Alternatively and/or additionally, the contamination could be particles or the like of materials from apparatus used upstream within the fuel flow system.

It is an object of the present invention to prevent the nozzle from being clogged with contamination, thus resulting in a change of effective geometry of the nozzle. One proposed solution would be to use fine or finer filters in the fuel flow system to prevent contamination with an average diameter smaller than the nozzle diameter (i.e., the opening of the nozzle) from reaching the nozzle. However, this may then result in a blockage of the fuel flow system as a whole (i.e., at that filter), which could again result in the need to regularly maintain or repair the droplet generator, causing significant downtime of the radiation source and/or the lithographic apparatus as a whole. The present invention provides an alternative approach to the problems identified above, which does not result in increasing the chances of blockages being formed within the fuel flow system (which includes the nozzle).

According to an aspect of the present invention, there is provided a radiation source comprising a nozzle to direct a stream of fuel droplets along a trajectory towards a plasma formation location. The radiation source also comprises, or is at least in connection with (in use), a laser configured to direct laser radiation at the fuel droplets at the plasma formation location to generate, in use, a radiation generating plasma, all as described above. The invention is distinguished from existing radiation sources and/or nozzles in that the nozzle has an internal surface that is deliberately configured to prevent contamination present in fuel used to form the fuel droplets from being deposited on that internal surface. In one example, this may be achieved by ensuring that the internal surface is non-stick with respect to the contamination, and/or ensuring that the internal surface is smooth enough to prevent such deposition. An advantage of this approach is that further blockages are not encouraged or likely. Instead, the contamination is flushed out of the fuel flow system, and in particular from the nozzle, thus preventing blockages, and thus preventing changes in the effective geometry of the nozzle. It is conceded that the contamination may end up in one or more of the fuel droplets directed from the nozzle. However, this is preferable to the nozzle becoming clogged with contamination, with the otherwise resulting effect of a potential change in the trajectory of the stream of fuel droplets, and/or a change in other properties of the fuel droplets, for example their size or shape, or the frequency of their generation.

Embodiments of the present invention will now be described, by way of example only, with reference to FIGS. 5 and 6. The Figures have not been drawn to any particular scale. The same features are given the same reference numerals for clarity and consistency.

Figure 5:
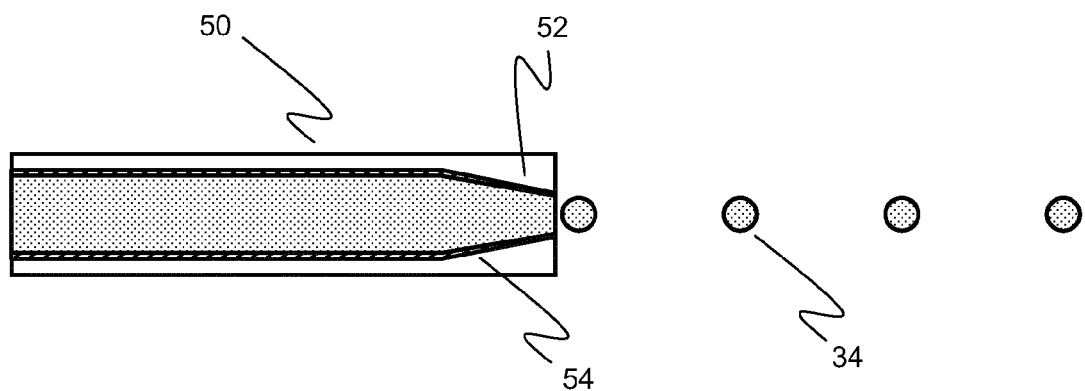
FIG. 5 schematically depicts a nozzle in accordance with a first embodiment of the present invention.
Figure 6:
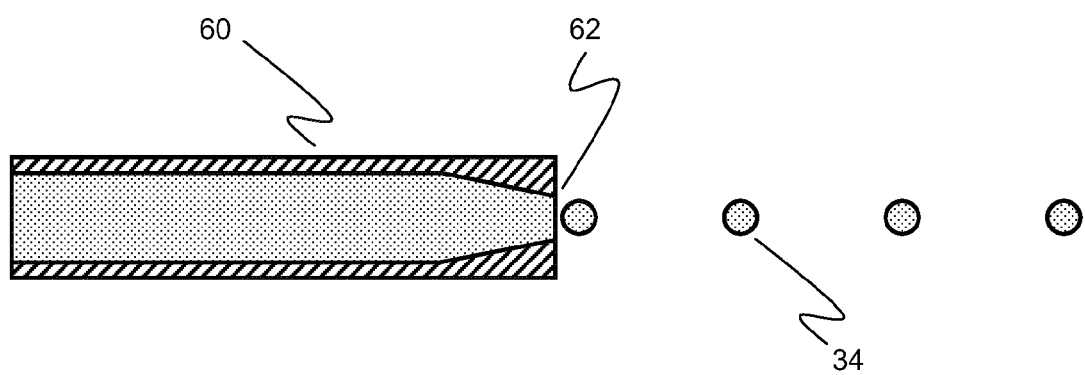
FIG. 6 schematically depicts a nozzle according to a second embodiment of the present invention.

FIG. 5 schematically depicts a conduit 50 that includes and leads to a nozzle 52 in accordance with an embodiment of the present invention. In this embodiment, an internal surface of the nozzle 52 (and, indeed, conduit 50) is provided with a coating 54. The coating 54 is configured to prevent contamination present in fuel used to form the fuel droplets 34 from being deposited on the coating 54. For instance, the coating 54 may provide a smoother surface for the contamination than the material on which the coating 54 has been applied (e.g., the body material of the nozzle 52). Alternatively, the coating 54 may provide a less sticky surface for the contamination than material on which the coating 54 is applied. For instance, the fuel may be tin and the nozzle 52 formed substantially from quartz. The quartz surface can be made smoother or less sticky (to, for example, tin oxide particles at least) by applying such a coating 54.

The coating 54 needs to be provided uniformly and evenly, to provide a uniform and even surface. The coating should also be capable of withstanding an operating temperature of the fuel and/or nozzle (or fluid flow system in general) so that the coating does not degrade or rapidly degrade during use. For instance, if tin is the fuel that is used, the coating should be able to withstand a temperature of greater than 232° C. (i.e., the melting point of tin).

The coating 54 could be or comprise one of a number of different materials, for example: a fluoride ($CaF_2$, $BaF_2$); a nitride; DLC (diamond-like carbon); Teflon (i.e., PTFE—polytetrafluoroethylene); or a material derived from a sol-gel coating process (e.g., a silicon or silica based coating, such as for example $SiO_2$:$CH_3$).

In some instances, any one or more of the abovementioned materials may be usable as the coating 54. However, diamond-like carbon may not always be suitable, depending on the aspect ratio of the nozzle, which may prevent readily applicable deposition of the diamond-like carbon coating (e.g., using gas phase deposition). Nitrides may be too rough, and may not adequately prevent the build up of contamination in the nozzle. Fluorides may not be suitable due to the fact that it may be too difficult to apply fluorides as a coating. In contrast, PTFE and a material derived from a sol-gel coating process (e.g., a silicon or silica based coating, such as for example $SiO_2$:$CH_3$) has been found to be particularly suitable, satisfying all the requirements defined above.

The coating 54 may be provided in a wet coating process that may more readily facilitate the provision of the coating 54, and in particular the more uniform coating, of the internal surface of the nozzle 52. The coating 54 may be provided using a sol-gel coating process, or using a coating provided in liquid suspension. Once the internal surface of the nozzle has been coated, a curing process may be undertaken to provide the final, solid coating (e.g., to evaporate any water content and/or to sinter particles onto the internal surface).

In use, contamination such as tin oxide particles does not and cannot deposit on an internal surface of the nozzle 52 due to the presence of the coating 54. Thus in accordance with the embodiment of the present invention, the contamination is flushed out of the conduit 50 through the nozzle 52 and does not alter the effective geometry of the nozzle 52.

The wet coating process will usually involve passing a wet coating through the nozzle in order to coat that nozzle, and this may involve passing that wet coating through a conduit leading to and ending with that nozzle, and/or other parts of a fuel flow system that ends with the nozzle. The conduit, nozzle or fuel flow system in general may comprise one or more filters, through which the wet coating might need to pass. A wet coating process might be preferred in comparison with, for example, a gas coating process. For example, a gas might be more likely to be depleted of its active (i.e., coating) component before it reaches the nozzle, especially if the gas flows through a filter. Also, a velocity distribution in the nozzle (or conduit, or fluid flow system in general) for a wet coating will be substantially the same as that for the fuel itself (the fuel being a liquid), making the behaviour (and the like) and the like of the wet coating easier to predict and thus easier to apply in a predictable consistent manner. A gas, however, would not behave in the same way since it is a compressible medium, and thus the use of a gas might give rise to certain pressure induced effects that could be hard to predict and take into account, which could lead to coating difficulties (e.g., non-uniformities in thickness or the like).

In accordance with another embodiment of the present invention, the abovementioned advantages may be realised by forming the nozzle from a body of material (as opposed to a coating) that is configured to prevent contamination present in the fuel used to form the fuel droplets from being deposited on that internal surface. FIG. 6 shows a conduit 60 and nozzle 62 formed from such a material. Again, the material is chosen such that it is smoother or less sticky for contamination contained within the fuel than material used in previously proposed or existing nozzles. The material is deliberately chosen to achieve this. For instance, proposed nozzles have been described as comprising or being formed from quartz. Contamination (e.g., tin oxide, at least) is known to deposit readily on an internal surface of a nozzle formed from quartz. Forming a nozzle from a smoother or less sticky material overcomes this problem. For instance, the nozzle may be formed from one of a number of materials, for example diamond, or a glass, or a metal (e.g., molybdenum, tungsten), or a ceramic. Such materials also satisfy the abovementioned requirements already described in relation to the coating, and in particular are capable of withstanding a temperature of greater than 232° C.

Any problems of applying a coating to the surface are no longer present in this embodiment, since the nozzle itself is formed from the body of such material. The only requirement is that the material used to form the nozzle is able to support a conduit extending through the material, through which the fuel may flow. To achieve this, a casing or scaffold may be provided around the nozzle to promote or maintain structural integrity.

Although the abovementioned embodiment has been described in relation to a radiation source, the use of a nozzle as described above may be particularly useful in other applications where nozzles for use in liquid droplet generators are required, for example in the field of ink-jet printing or the like.

It will be appreciated that, in all embodiments, the smooth or non-stick materials that are required to form the coating, or to form the nozzle, may vary depending on the particularly prevalent type of contamination that is present, in use, in liquid that flows through the nozzle. The exact requirements may depend on a number of different properties, for example contact angles, surface interactions and forces and the like. However, the skilled person will appreciate that appropriate materials may be chosen for appropriate applications, as and when required.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims that follow.

The invention claimed is:

1. A radiation source comprising:
    a nozzle configured to direct a stream of fuel droplets along a trajectory towards a plasma formation location; and
    a laser configured to direct laser radiation at the fuel droplets at the plasma formation location to generate, in use, a radiation generating plasma,
    wherein the nozzle has an internal surface that is configured to prevent contamination present in fuel used to form the fuel droplets from being deposited on that internal surface, the internal surface comprising a coating and wherein the coating comprises polytetrafluoroethylene, or a material derived from a sol-gel coating process.

2. The radiation source of claim 1, wherein the coating provides a smoother or less sticky surface for the contamination than material on which the coating is applied.

3. The radiation source of claim 1, wherein the coating is capable of withstanding a temperature of greater than 232° C.

4. The radiation source of claim 1, wherein the internal surface is a surface of a body of material used to form the nozzle.

5. The radiation source of claim 4, wherein the body of material comprises diamond, or a glass, or a metal, or a ceramic.

6. The radiation source of claim 1, wherein the fuel comprises tin, and/or wherein the contamination comprises tin oxide particles.

7. A lithographic apparatus, comprising:
    a radiation source comprising:
        a nozzle configured to direct a stream of fuel droplets along a trajectory towards a plasma formation location; and
        a laser configured to direct laser radiation at the fuel droplets at the plasma formation location to generate, in use, a radiation generating plasma,
        wherein the nozzle has an internal surface that is configured to prevent contamination present in fuel used to form the fuel droplets from being deposited on that internal surface, the internal surface comprising a coating and wherein the coating comprises polytetrafluoroethylene, or a material derived from a sol-gel coating process;
    an illumination system configured to provide the radiation beam;
    a patterning device configured to impart the radiation beam with a pattern in its cross-section;
    a substrate holder configured to hold a substrate; and
    a projection system configured to project the patterned radiation beam onto a target portion of the substrate.

8. A nozzle for use in a liquid droplet generator of a radiation source, wherein the nozzle has an internal surface that is configured to prevent contamination present in liquid used to form the liquid droplets from being deposited on that internal surface, the internal surface comprising a coating and wherein the coating comprises polytetrafluoroethylene, or a material derived from a sol-gel coating process.

9. A method of forming a nozzle for use in a liquid droplet generator of a radiation source, the method comprising:
    forming a nozzle from a body of material; and
    providing the nozzle with an internal surface configured to prevent contamination present in liquid used to form the liquid droplets from being deposited on that internal surface and wherein a wet coating process is used to provide the internal surface in the form of a coating.

10. The method of claim 9, wherein the coating is provided using a sol-gel coating process, or using a coating in fluid suspension.

11. The method of claim 10, wherein a liquid used in the wet coating process is cured after being applied.

12. The method of claim 9, wherein the internal surface is provided by forming a conduit through the body of material used to form the nozzle.

* * * * *